United States Patent
Gupta et al.

(10) Patent No.: US 8,258,863 B2
(45) Date of Patent: Sep. 4, 2012

(54) CIRCUIT AND METHOD FOR REDUCING INPUT LEAKAGE IN CHOPPED AMPLIFIER DURING OVERLOAD CONDITIONS

(75) Inventors: Amit K. Gupta, Richardson, TX (US); Karthikeyan Soundarapandian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/930,366

(22) Filed: Jan. 5, 2011

(65) Prior Publication Data
US 2012/0169416 A1 Jul. 5, 2012

(51) Int. Cl.
*H03F 1/02* (2006.01)
(52) U.S. Cl. .......................................... 330/9
(58) Field of Classification Search ................ 330/9, 51; 327/124, 307
See application file for complete search history.

(56) References Cited

U.S. PATENT DOCUMENTS 6,515,540 B1 * 2/2003 Prasad et al. ...................... 330/9
7,292,095 B2 11/2007 Burt et al. ........................ 330/9

OTHER PUBLICATIONS

"A Low Noise, Low Residual Offset, Chopped Amplifier for Mixed Level Applications" by Sanduleanu et al., IEEE © 1998, pp. 333-336.
"Circuit Techniques for Reducing the Effects of Op-Amp Imperfections: Autozeroing, Correlated Double Sampling, and Chopper Stabilization" by Enz et al., IEEE, vol. 84, No. 11, Nov. 1996, pp. 1584-1614.

* cited by examiner

*Primary Examiner* — Steven J Mottola
(74) *Attorney, Agent, or Firm* — John J. Patti; Wade J. Brady, III; Frederick J. Telecky, Jr.

(57) ABSTRACT

A chopper-stabilized amplifier (20A) includes an amplifier (3), an input chopper (2A) having a first input (4) receiving an input signal ($V_{IN}{}^+$), an output (5) coupled to a first input of the amplifier, and a feedback resistor (9) coupled to an output (6) of the amplifier to couple a feedback signal ($V_{FB}{}^+$) to a second input of the amplifier (3). The input chopper operates in response to a chopping clock (CHOP_CLK). If the amplifier (3) is unacceptably close to a saturation condition, the chopping clock (CHOP_CLK) is disabled to reduce input leakage current ($I_{LEAKAGE}$) of the chopper-stabilized amplifier.

19 Claims, 4 Drawing Sheets

CIRCUIT AND METHOD FOR REDUCING INPUT LEAKAGE IN CHOPPED AMPLIFIER DURING OVERLOAD CONDITIONS

BACKGROUND OF THE INVENTION

The present invention relates generally to chopper-stabilized amplifiers, and more particularly to chopper-stabilized amplifiers and methods which result in very low input leakage current during output overload conditions.

Referring to FIG. 1, a conventional chopper-stabilized INA (instrumentation amplifier) 1A includes an operational amplifier 3 having its (+) input coupled by conductor 5 to one output of an input chopper 2. The (−) input of amplifier 3 is coupled by conductor 7 to another output of input chopper circuit 2. One input of input chopper 2 is coupled by conductor 4 to receive input voltage $V_{IN}^+$. Another input of input chopper 2 is coupled by conductor 8 and a feedback resistor 9 of resistance R2 to the output 6 of amplifier 3. Various parasitic capacitances, designated Cp, are coupled to conductors 5 and 7, respectively. Similarly, INA 1A also includes an operational amplifier 11 having its (+) input coupled by conductor 15 to one output of input chopper 10. The (−) input of amplifier 11 is coupled by conductor 13 to another output of input chopper 10. One input of input chopper 10 is coupled by conductor 12 to receive input voltage $V_{IN}^-$. Another input of input chopper 10 is coupled by conductor 18 and a feedback resistor 16 of resistance R2 to the output 14 of amplifier 11. Note that input choppers 2 and 10 in FIG. 1A can be similar to input chopper 2 in subsequently described FIG. 1B. A resistor 17 of resistance R1 is coupled between conductors 8 and 18. Various parasitic capacitances Cp are coupled to conductors 15 and 13, respectively. Input choppers 2 and 10 are clocked by a chopper clock signal CHOP_CLK. The differential input voltage $\Delta V_{IN}$ applied between input conductors 4 and 12 is equal to $V_{IN}^+ - V_{IN}^-$.

Note that amplifiers 3 and 11 each include a conventional output chopper circuit, which may be similar to output chopper 27 in subsequently described FIG. 1B. Output conductor 6 of amplifier 3 conducts the instrumentation amplifier output voltage $V_{OUT}^+$, and output conductor 14 of amplifier 11 conducts the instrumentation amplifier output voltage $V_{OUT}^-$, so the differential input voltage $\Delta V_{OUT}$ produced by chopper-stabilized INA 1A is equal to $V_{OUT}^+ - V_{OUT}^-$. The output chopper circuitry 27 in each of amplifiers 3 and 11 is clocked by chopper clock signal CHOP_CLK.

FIG. 1B is a schematic diagram of a conventional chopper-stabilized amplifier as shown in FIG. 2A of commonly owned U.S. Pat. No. 7,292,095 entitled "Notch Filter for Ripple Reduction in Chopper Stabilized Amplifiers" issued Nov. 6, 2007 to Burt et al. Input chopper 2 in FIG. 1B includes a (+) input terminal which receives an input voltage $V_{INPUT}^+$ and which is connected to one terminal of each of switches 41A and 44A. Input chopper 2 also includes a (−) input terminal which receives an input voltage $V_{INPUT}^-$ and which is connected to one terminal of each of switches 42A and 43A. Switches 43A and 44A are controlled by an internal chopping clock signal Φ and switches 41A and 42A are controlled by an internal chopping clock complement signal /Φ. Note that Φ in FIG. 1B can be the same as or be derived from CHOP_CLK in FIG. 1A.

The (+) input of a suitable amplifier, such as transconductance amplifier 3, is connected to a second terminal of each of switches 43A and 41A, and the (−) input of transconductance amplifier 3 is connected to a second terminal of each of switches 42A and 44A. The (+) output of transconductance amplifier 3 is coupled by conductor 56 to a first terminal of each of switches 42B and 43B of an output chopper circuit 27, and the (+) output of transconductance amplifier 3 is coupled by conductor 56 to a first terminal of each of switches 42B and 43B of output chopper circuit 27. An output conductor 58 of the chopper-stabilized amplifier shown in FIG. 1B is connected to a second terminal of each of switches 43B and 41B and conducts an output voltage $V_{OUTPUT}^+$, and another output conductor 59 of the chopper-stabilized amplifier is connected to a second terminal of each of switches 42B and 44B and conducts an output voltage $V_{OUTPUT}^-$. The switches in input chopper 2 and output chopper 27 may be implemented in various ways, for example by means of CMOS transmission gates. (Note that the operation of output chopper 27 does not significantly affect the input leakage current of the chopper-stabilized amplifier.)

The chopper-stabilized amplifier shown in FIG. 1B is essentially equivalent to the conventional chopper shown in FIG. 4 of the article "A Low Noise, Low Residual Offset, Chopped Amplifier for Mixed Level Applications" by M. Sanduleanu, A. van Tuigal, R. Wasasenaar, and H. Walling a, Electronics, Circuits and Systems, 1998 IEEE International Conference, September 7-10 in Lisboa, Portugal, ISBN 0-7803-5008-1, which is incorporated herein by reference. FIG. 5 of the Sanduleanu article shows another similar circuit in which output chopping switches are incorporated within rather than after the folded-cascode stage of the transconductance amplifier; the associated text of the Sanduleanu article describes the advantages of the implementation of FIG. 5 over the implementation of FIG. 4 for some applications.

For the normal operation of chopper-stabilized INA 1A in FIG. 1A, the following two equations are valid, assuming high amplifier gain:

$$DV_{OUT} = \left(1 + \frac{2R2}{R1}\right) DV_{IN}, \qquad \text{Equation 1}$$

where $\Delta V_{OUT} = V_{OUT}^+ - V_{OUT}^-$ and $\Delta V_{IN} = V_{IN}^+ + V_{IN}^-$;

$$\Delta V = 0. \qquad \text{Equation 2:}$$

The allowed input dynamic range of chopper-stabilized INA 1A is dependent on the gain term in Equation 1A, which is determined by resistors R1 and R2. Under the normal operating conditions for which Equations 1 and 2 are valid, the input leakage current $I_{LEAKAGE}$ is very small, e.g., a few picoamperes. However, when $\Delta V_{IN}$ exceeds the dynamic input voltage range limit of chopper-stabilized INA 1, its output becomes "saturated". Then Equation 2 is no longer valid, and leakage current $I_{LEAKAGE}$ increases dramatically, according to the expression $$I_{LEAKAGE} = 2Cp \times \Delta V \times f_{CHOP}, \qquad \text{Eqn. 3:}$$

where $f_{CHOP}$ is the input chopping frequency. The value of $I_{LEAKAGE}$ given by Equation 3 may be in the micrompere range, and is too high to be acceptable in many applications. For example, there are medical safety specifications which do not permit more than a certain amount of current, e.g., 1 microampere, to flow into or out of the human body. The ANSI/AAMI EC11 (American National Standard/Association for the Advancement of Medical Instrumentation) standard for diagnostic electrocardiographic devices limits the current flow into or out of the human body to less than 100 nA.

For biopotential measurements, it is important to determine whether or not the electrical connection of the electrode to the input of a chopper-stabilized amplifier has become loosened. For this purpose, a very small current (of the order of tens of nanoamperes) is injected into an electrode attached to a human body. The idea is that for an open electrode the amplifier input will reach the supply voltage rail and this can be detected. The excessive leakage current in the chopper-stabilized amplifier during saturation interferes with this detection as explained below. If the electrode has become disconnected, the input of the amplifier starts moving toward a supply voltage rail. This may cause the output of the chopper-stabilized amplifier to saturate for any gain greater than unity. If during saturation $I_{LEAKAGE}$ increases to a value larger than the current injected into or out of the human body, it may prevent the input signal from moving sufficiently close to the supply voltage, thereby interfering with reliable detection of the disconnection of the electrode from the human body. Therefore, it is essential to keep the leakage current low even during output overload conditions.

During normal amplifier operation, a very small input current, typically less than a picoampere, is all that flows if chopper stabilization is not being utilized. However, if the amplifier is chopper-stabilized, $I_{LEAKAGE}$ may be as little as only a few picoamperes during normal operation, but if an amplifier overload condition (also referred to herein as a saturation condition) occurs, that value of $I_{LEAKAGE}$ may increase (e.g., by a factor of more than a million) to a number of micromperes.

The term amplifier "overload" or "saturation" as used herein refers to the condition wherein the product of the amplifier input voltage $\Delta V_{IN}$ multiplied by the amplifier gain exceeds $V_{DD}-V_{SS}$. Most systems that include an amplifier try to correct a situation in which an amplifier output is attempting to exceed a supply voltage, i.e., where the amplifier output voltage is "saturating". Often, this is accomplished by reducing the amplifier gain to unity to prevent or correct the saturation condition. A conventional technique for accomplishing this is to use gain control circuitry to reduce the amplifier gain to unity. Often, a DSP (digital signal processor) in the system first recognizes the saturation condition from digitized data representing the amplifier output voltage. The DSP then supplies control signals to the gain control circuitry to reduce the amplifier gain so as to eliminate the saturation condition.

However, users of currently available chopper-stabilized amplifiers see only a digitized representation of the output of the amplifier, and they see it only after a substantial delay. Consequently, the DSP observes the digitized output and then takes appropriate corrective action only after the substantial delay. Unfortunately, the foregoing technique for preventing amplifier overload/saturation conditions by reducing the amplifier gain is not acceptable as a way of reducing $I_{LEAKAGE}$.

Thus, there is an unmet need for a chopper-stabilized amplifier having very low input leakage current during amplifier overload conditions.

There also is an unmet need for a chopper-stabilized amplifier which is capable of meeting very low input leakage current specifications required for any application which needs an amplifier having high input impedance, including applications for medical devices in which the maximum input leakage current is set forth by established standards.

There also is an unmet need for a chopper-stabilized amplifier which automatically limits increases of input leakage current that occur during amplifier overload/saturation conditions.

There also is an unmet need for a chopper-stabilized amplifier which avoids the need for a user to detect an amplifier overload/saturation condition and take corrective action to prevent excessive input leakage current.

SUMMARY OF THE INVENTION

It is an object of the invention to provide a chopper-stabilized amplifier and method for providing very low amplifier input leakage current during amplifier overload conditions.

It is another object of the invention to provide a chopper-stabilized amplifier and method which are capable of meeting very low input leakage current specifications required for any application which needs an amplifier having high input impedance, including applications for medical devices in which the maximum input leakage current is set forth by established standards.

It is another object of the invention to provide a chopper-stabilized amplifier which automatically limits increases of input leakage current that occur during amplifier overload/saturation conditions.

It is another object of the invention to provide a chopper-stabilized amplifier which avoids the need for a user to detect an amplifier overload/saturation condition and take corrective action to prevent excessive amplifier input leakage current.

It is another object of the invention to provide an integrated circuit chopper-stabilized amplifier capable of internally detecting a saturation or near-saturation condition and automatically disabling internal input signal chopping operation in response to the detection of the saturation or near-saturation condition.

Briefly described, and in accordance with one embodiment, the present invention provides a chopper-stabilized amplifier (20A) that includes an amplifier (3), an input chopper (2A) having a first input (4) receiving an input signal ($V_{IN}^+$), an output (5) coupled to a first input of the amplifier, and a feedback resistor (9) coupled to an output (6) of the amplifier to couple a feedback signal ($V_{FB}^+$) via a second input (8) and a second output (7) of the input chopper (2A) to a second input of the amplifier (3). The input chopper operates in response to a chopping clock (CHOP_CLK). If the amplifier (3) is unacceptably close to a saturation condition, the chopping clock (CHOP_CLK) is disabled to reduce input leakage current ($I_{LEAKAGE}$) of the chopper-stabilized amplifier.

In one embodiment thereof, the invention provides a chopper-stabilized amplifier (20A) including a first amplifier (3), a first input chopper circuit (2A) having a first input (4) coupled to receive a first input signal ($V_{IN}^+$), a first output (5) coupled to a first input (+) of the first amplifier (3), and a second output (7) coupled to a second input (−) of the first amplifier (3). The second input (−) of the first amplifier (3) is coupled to receive a first feedback signal ($V_{FB}^+$). The first chopper input circuit (2A) operates in response to a chopping clock (CHOP_CLK) and in response to a chop enable signal (CHOP_EN). A first feedback resistor (9) is coupled between an output (6) of the first amplifier (3) and the second input (−) of the first amplifier (3) to produce the first feedback signal ($V_{FB}^+$). A gain resistor (17) has a first terminal coupled to the second input (−) of the first amplifier (3) and a second terminal (18) coupled to receive a predetermined voltage. Saturation detection circuitry (52-1) is coupled to a signal path in the chopper-stabilized amplifier (20A) for the purpose of comparing a signal level (e.g., $V_{IN}^+$ or $V_{OUT}^+$) in the signal path to a reference to generate the chop enable signal (CHOP_EN) if the amplifier is in a normal operating mode and disabling the chop enable signal (CHOP_EN) if the first amplifier (3) is unacceptably close to a saturation condition. In one embodiment, the first input chopper circuit (2A) couples a chopped representation of the first feedback signal ($V_{FB}^+$) from a second input (8) of the first chopper circuit (2A) to the second (−) input of the first amplifier (3).

In one embodiment, a chopping enable circuit (34) includes an ANDing circuit (54) having a first input for receiving the chopping clock (CHOP_CLK) and an enable input for receiving the chop enable signal (CHOP_EN), and an output for producing an enabled chopping clock signal (Φ) for controlling chopping switches (41,42,43,44) in the first input chopper circuit (2A).

In one embodiment, the first amplifier (30) includes output chopper circuitry (27 in FIG. 1B) coupled to the output (6) of the first amplifier (3), and a first output signal ($V_{OUT}^+$) of the chopper-stabilized amplifier (20) is generated by the output chopper circuitry (27) on the output (6) of the first amplifier (3).

In one embodiment, the chopping enable circuit (34) includes circuitry (55) for generating an enabled chopping clock complement signal (/Φ) which is the logical complement of the enabled chopping clock (Φ).

In one embodiment, the saturation detection circuitry (52-1 in FIG. 2) includes a first comparator (23) having a first input (+) coupled to a first reference voltage ($V_{33}$), a second input (−) coupled to receive the first output signal ($V_{OUT}^+$), and an output coupled to a first input of an ORing circuit (22) having an output (21) on which the chopper enable signal (CHOP_EN) is produced. A second comparator (25) has a first input (+) coupled to receive the first output signal ($V_{OUT}^+$) and a second input (−) coupled to a second reference voltage ($V_{32}$), and also has an output coupled to a second input of the ORing circuit (22).

In one embodiment, the saturation detection circuitry (52-2 in FIG. 4) includes a first comparator (25) having a built-an offset (Vos) and also having a first input (+) coupled to the first input signal ($V_{IN}^+$), a second input (−) coupled to receive the first feedback signal ($V_{FB}^+$), and an output coupled to a first input of an ORing circuit (22). The ORing circuit (22) has an output (21) on which the chopper enable signal (CHOP_EN) is produced. A second comparator (24) has a first input (+) coupled to receive the first feedback signal ($V_{FB}^+$) and a second input (−) coupled to receive the first input signal ($V_{IN}^+$), and also has an output coupled to a second input of the ORing circuit (22).

In one embodiment, the first amplifier (3) is powered by a first supply voltage ($V_{DD}$) and a second supply voltage ($V_{SS}$), the chopper-stabilized amplifier (20A) including a reference circuit including first (29), second (30), and third (31) resistors coupled in series between the first supply voltage ($V_{DD}$) and the second supply voltage ($V_{SS}$). The first resistor (29) is coupled between the first supply voltage ($V_{DD}$) and the second reference voltage ($V_{32}$), the second resistor (30) is coupled between the second reference voltage ($V_{32}$) and the first reference voltage ($V_{33}$), and the third resistor (31) is coupled between the first reference voltage ($V_{33}$) and the second supply voltage ($V_{SS}$).

In one embodiment, the chopper-stabilized amplifier is a chopper-stabilized instrumentation amplifier (20-1) including the first amplifier (3), the first input chopper circuit (2A), the first feedback resistor (9), the gain resistor (17), and the saturation detection circuitry (52-1). The instrumentation amplifier (20-1) also includes a second amplifier (11) having an output (14) on which a second output signal ($V_{OUT}^-$) is produced, a second input chopper circuit (10A) having a first input (12) coupled to receive a second input signal ($V_{IN}^-$), a second input (18) coupled to receive a second feedback signal ($V_{FB}^-$), a first output (15) coupled to a first input (+) of the second amplifier (11), and a second output (13) coupled to a second input (−) of the second amplifier (11). The second input chopper circuit (10A) operates in response to the chopping clock (CHOP_CLK) and in response to the chop enable signal (CHOP_EN). A second feedback resistor (16) is coupled between an output (14) of the second amplifier (11) and the second input (18) of the second input chopper circuit (10A) to produce the second feedback signal ($V_{FB}^-$). The second terminal of the gain resistor (17) is coupled to the second input (18) of the second input chopper circuit (10A). The saturation detection circuitry (52-1 in FIG. 2) includes a third comparator (24) having a first input (+) coupled to receive the second output signal ($V_{OUT}^-$), a second input (−) coupled to the second reference voltage ($V_{32}$), and an output coupled to a third input of the ORing circuit (22). The saturation detection circuitry (52-1) also includes a fourth comparator (26) having a first input (+) coupled to receive the first reference voltage ($V_{33}$), a second input (−) coupled to receive the second output signal ($V_{OUT}^-$), and an output coupled to a fourth input of the ORing circuit (22).

In one embodiment, the input chopper circuit (2A) includes first (44A), second (43A), third (41A), and fourth (42A) switches, the first switch (44A) being controlled by the enabled chopping clock signal (Φ) and having a first terminal (55), and also having a second terminal coupled to the second input (−) of the first amplifier (3). The second switch (43A) is controlled by the enabled chopping clock signal (Φ) and has a first terminal (51), and also has a second terminal coupled to the first input (+) of the first amplifier (3). An input difference signal (e.g., ΔV or $\Delta V_{IN}$) is applied between the first terminals of the first (44A) and second (43A) switches. The third switch (41A) is controlled in accordance with the enabled chopping clock complement signal (/Φ) and has a first terminal coupled to the first terminal (55) of the first switch (44A) and a second terminal coupled to the first input (+) of the first amplifier (3). The fourth switch (42A) is controlled in accordance with the enabled chopping clock complement signal (/Φ) and has a first terminal coupled to the first terminal of the third switch (43A) and a second terminal coupled to the second input (−) of the first amplifier (3).

In one embodiment, the first (3) and second (11) amplifiers are transconductance amplifiers.

In one embodiment, the first (23), second (25), third (24), and fourth (26) comparators have lower offset and higher bandwidth than the first (3) and second (11) amplifiers.

In one embodiment, the predetermined voltage (18) is a fixed reference voltage.

In one embodiment, the invention provides a method for reducing input leakage current ($I_{LEAKAGE}$) in a chopper-stabilized amplifier (20A) including an amplifier (3), an input chopper circuit (2A) having a first input (4) coupled to receive an input signal ($V_{IN}^+$), and an output (5) coupled to a first input (+) of the amplifier (3), a feedback resistor (9) being coupled to an output (6) of the amplifier (3) to couple a feedback signal ($V_{FB}^+$) to a second input (−) of the amplifier (3), the chopper-stabilized amplifier (20A) producing an output signal ($V_{OUT}^+$), wherein the input chopper circuit (2A) operates in response to a chopping clock (CHOP_CLK), the method including operating the chopper-stabilized amplifier (20A) in a normal mode; determining if the amplifier (3) is unacceptably close to a saturation condition by comparing a signal level (e.g., $V_{OUT}^+$ or $V_{IN}^+$) in a signal path of the chopper-stabilized amplifier (20A) to a reference value (e.g., $V_{32}$, $V_{33}$ or Vos); and disabling the chopping clock (CHOP_CLK) if the amplifier (3) is determined to be unacceptably close to the saturation condition.

In one embodiment, the method includes logically ANDing the chopping clock (CHOP_CLK) and a chop enable signal (CHOP_EN) to produce an enabled chopping clock signal (Φ) for controlling chopping switches (41A,42A,43A, 44A) in the input chopper circuit (2A) during the operation in the normal mode.

In one embodiment, the method includes comparing a difference between a first reference voltage ($V_{33}$) and the output signal ($V_{OUT}^+$) and disabling the enabled chopping clock signal (Φ) if that difference is positive, and comparing a difference between the first output signal ($V_{OUT}^+$) and a second reference voltage ($V_{32}$) and disabling the enabled chopping clock signal (Φ) if that difference is positive.

In one embodiment, the invention provides a chopper-stabilized amplifier (20A) having low input leakage current ($I_{LEAKAGE}$), the chopper-stabilized amplifier (20A) including an amplifier (3), and an input chopper circuit (2A) having a first input (4) coupled to receive an input signal ($V_{IN}^+$), an output (5) coupled to a first input (+) of the amplifier (3), a feedback resistor (9) being coupled to an output (6) of the amplifier (3) to couple a feedback signal ($V_{FB}^+$) to a second input (−) of the amplifier (3), the chopper-stabilized amplifier (20A) producing an output signal ($V_{OUT}^+$), wherein the first chopper input circuit (2A) operates in response to a chopping clock (CHOP_CLK) and in response to a chop enable signal (CHOP_EN), the chopper-stabilized amplifier (20A) including means (34,2A,3) for operating the chopper-stabilized amplifier (20A) in a normal mode; means (e.g., 52-1 or 52-2) for determining if the amplifier (3) is unacceptably close to a saturation condition by comparing a signal level (e.g., $V_{OUT}^+$ or $V_{IN}^+$) in a signal path of the chopper-stabilized amplifier (20A) to a reference value (e.g., $V_{32}$, $V_{33}$ or Vos); and means (22,21) for disabling the chopping clock (CHOP_CLK) if the amplifier (3) is determined to be unacceptably close to the saturation condition.

DETAILED DESCRIPTION OF THE PREFERRED EMBODIMENTS

Figure 1A:
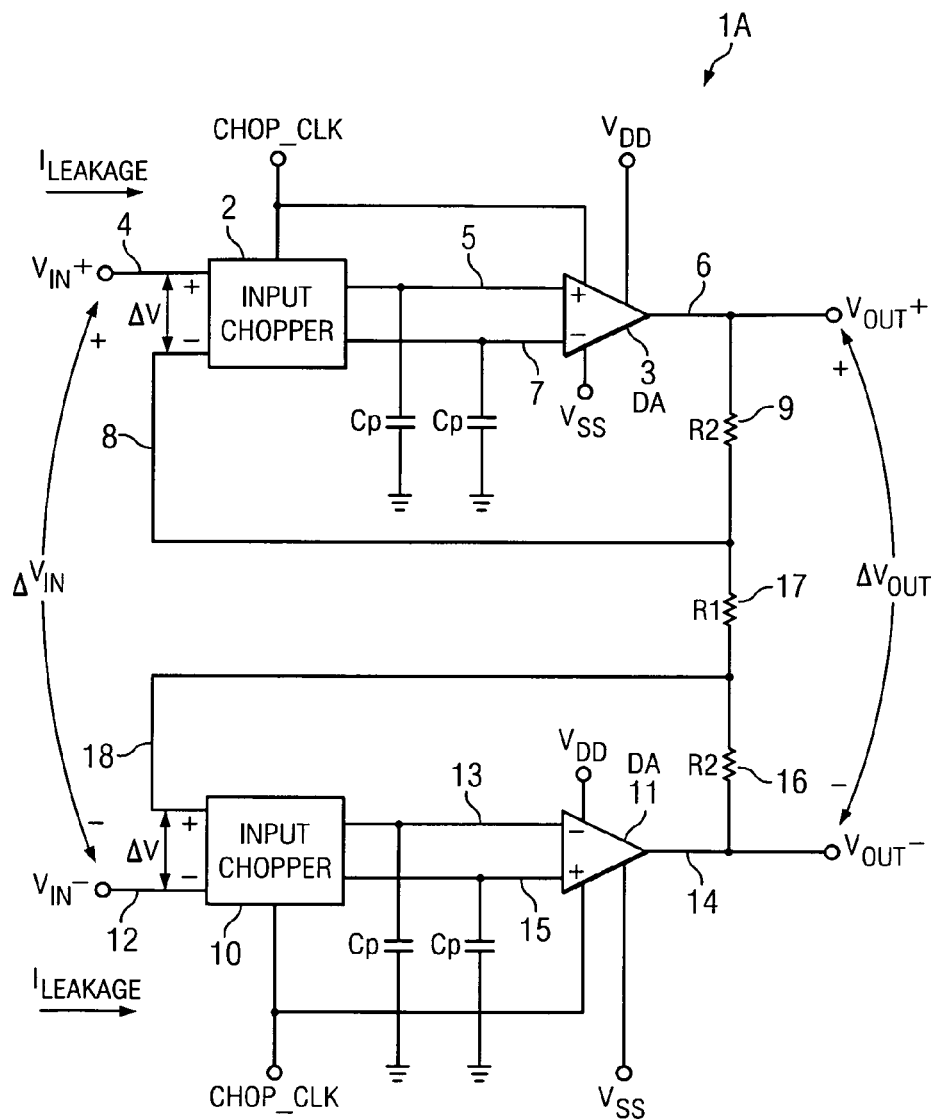
FIG. 1A is a block diagram of a conventional chopper-stabilized instrumentation amplifier.
Figure 1B:
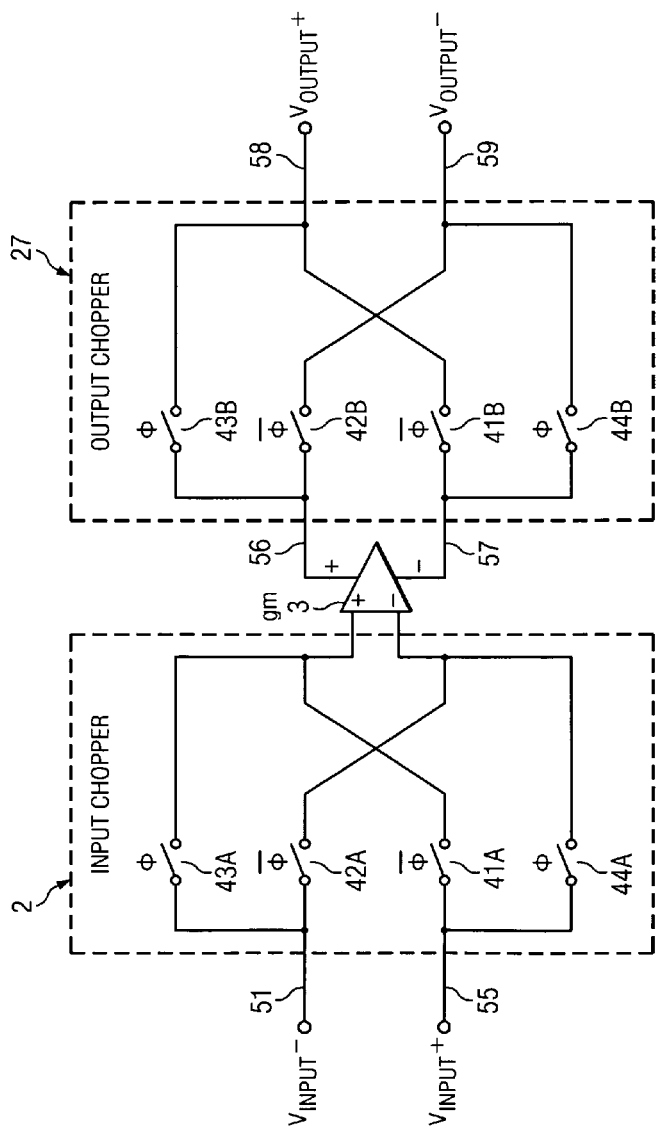
FIG. 1B is a basic schematic diagram of a conventional chopper-stabilized amplifier.
Figure 2:
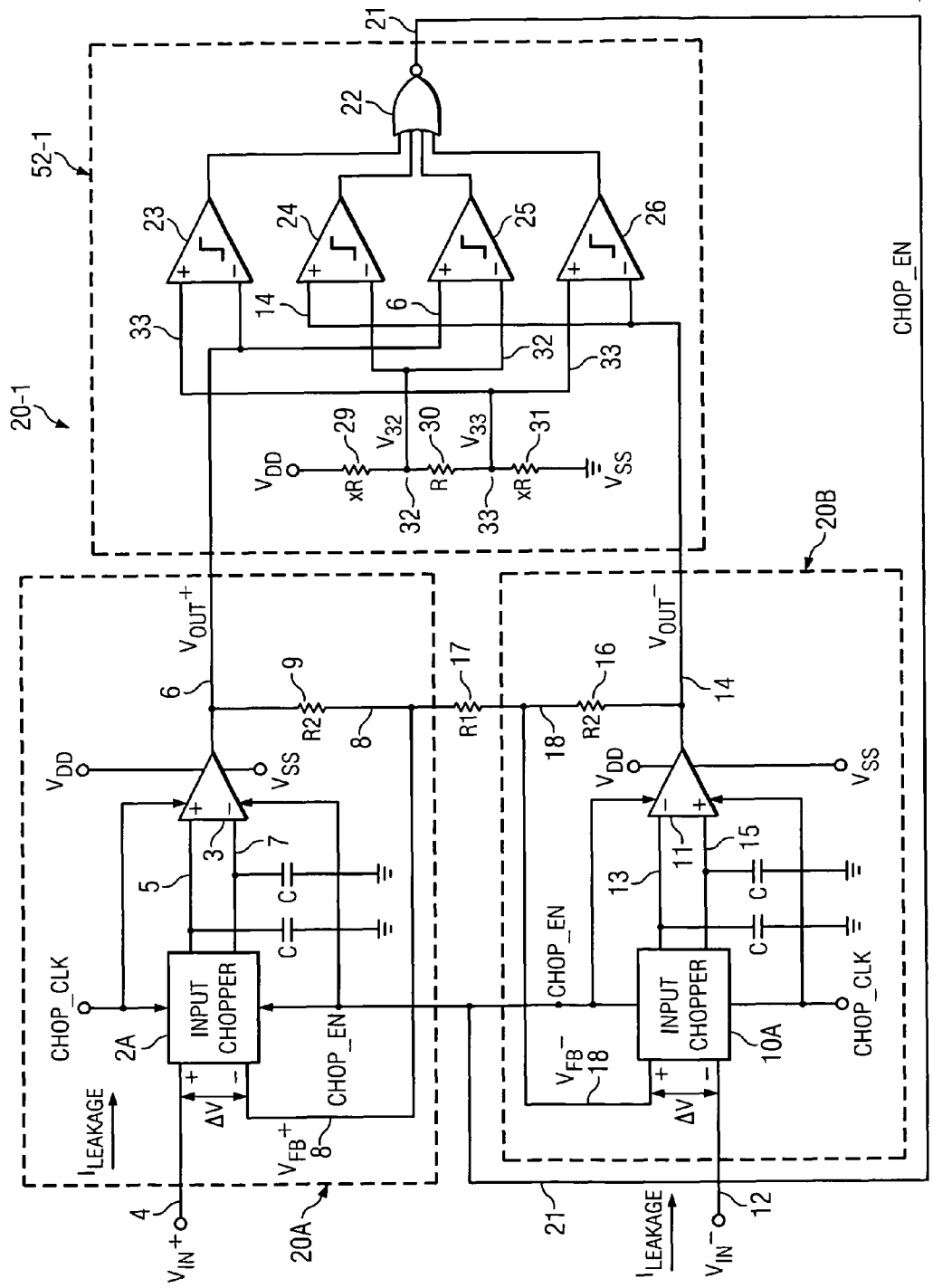
FIG. 2 is a schematic diagram of a preferred embodiment of the present invention.

Referring to FIG. 2, chopper-stabilized instrumentation amplifier (INA) 20-1 includes an "upper" chopper-stabilized amplifier 20A including input chopper 2A, amplifier 3, and an output chopper 27A. INA 20-1 also includes a "lower" chopper-stabilized amplifier 20B including input chopper 10A, amplifier 11, and output chopper 28A. Amplifiers 3 and 11 each include an output chopper circuit that may be essentially the same as output chopper 27 in previously described FIG. 1B. Input chopper 2A also may be implemented essentially the same as in input chopper 2 in FIG. 1B, and depending on the particular application requirements, the combination of input chopper 2 and amplifier 3 in FIG. 2 may be the same as the input chopper, folded-cascode amplifier, and output chopper shown in FIG. 4 of the previously mentioned article "A Low Noise, Low Residual Offset, Chopped Amplifier for Mixed Level Applications" by M. Sanduleanu, A. van Tuigal, R. Wasasenaar, and H. Walling a. That is, input chopper 2A in FIG. 2 may be essentially the same as input chopper 2 in FIG. 1B, the amplifying circuitry in amplifier 3 of FIG. 2 may be essentially the same as the differential input stage and folded-cascode circuit shown in FIG. 4 of the Sanduleanu article, and the output chopper in amplifier 3 of FIG. 2 may be essentially the same as output chopper 27 in FIG. 1B.

Alternatively, amplifier 3 in FIG. 2 may be essentially the same as the differential input stage and folded-cascode stage shown in FIG. 5 of the Sanduleanu article, wherein input chopper 2A is essentially the same as input chopper 2 in FIG. 1B, and wherein the amplifying circuitry and output chopper in amplifier 3 of FIG. 2 are essentially the same as the differential input stage and folded-cascode circuit with its built-in upper and lower output chopper circuits as shown in FIG. 5 of the Sanduleanu article.

One input of input chopper 2A is coupled by conductor 4 to receive input voltage V. Amplifier 3 has its (+) input coupled by conductor 5 to one output of input chopper 2A. The (−) input of amplifier 3 is coupled by conductor 7 to another output of input chopper 2A. Another input of input chopper 2A receives a feedback signal $V_{FB}^+$ on conductor 8, which is coupled by feedback resistor R2 to the output 6 of amplifier 3. Parasitic capacitances Cp are coupled to conductors 5 and 7. An input leakage current $I_{LEAKAGE}$ flows through input conductor 4.

Similarly, in chopper-stabilized amplifier 20B one input of input chopper 10A is coupled by conductor 12 to receive input voltage $V_{IN}^-$. Amplifier 11, which may be the same as above described amplifier 3, has its (+) input coupled by conductor 15 to one output of input chopper 10A, which may be the same as above described input chopper 2A. The (−) input of amplifier 11 is coupled by conductor 13 to another output of input chopper 10A. Another input of input chopper 10A receives a feedback signal $V_{FB}^-$ on conductor 18, which is coupled by a feedback resistor 16 of resistance R2 to the output 14 of amplifier 11. An input leakage current $I_{LEAKAGE}$ flows through input conductor 12. A gain resistor R1 is coupled between conductors 8 and 18. Parasitic capacitances Cp are coupled to conductors 15 and 13.

Figure 3:
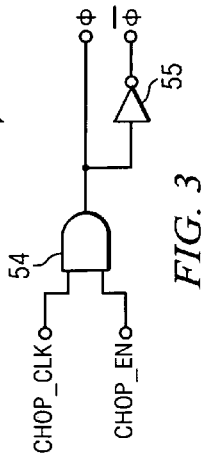
FIG. 3 is a logic diagram of chopping clock enable circuitry included in input chopper circuit 2 of FIG. 2.

As shown in FIG. 3, input choppers 2A and 10A are clocked by an enabled chopper clock signal Φ that is generated in response to chopper clock signal CHOP_CLK and a chopper enable signal CHOP_EN. In FIG. 3, chopping clock enable circuit 34 includes an AND gate 54 having one input coupled to receive chopping clock CHOP_CLK and another input coupled to receive the chopping clock enable signal CHOP_EN. The output of AND gate 54 produces the internal enabled chopping clock signal Φ (see FIG. 1B), and is also connected to the input of an inverter 55 which generates the internal enabled logical chopping clock complement signal /Φ. The chopping clock enable circuit 34 shown in FIG. 3 may be either external to or included in each of input choppers 2A and 10A, and similarly for the output chopper 27 included in each of amplifiers 3 and 11 in order to generate the internal chopping signal Φ and its logical complement signal /Φ required in each of input choppers 2A and 10A and also required in the output chopper 27 included in each of amplifiers 3 and 11 (see FIG. 1B).

In FIG. 2, output conductor 6 of amplifier 3 conducts the output voltage $V_{OUT}^+$ of chopper-stabilized amplifier 20-1, and output conductor 14 of amplifier 11 conducts the output voltage $V_{OUT}^-$ thereof.

Chopper-stabilized INA 20-1 includes a saturation detection circuit 52-1 which determines from the values of $V_{OUT}^+$ and $V_{OUT}^-$, when INA 20-1 is in or close to being in a saturation or overload condition. If that condition is detected, saturation detection circuit 52-1 operates to disable chopping operation by input choppers 2A and 10A (and also the above mentioned output choppers 27), to thereby prevent the previously described large increases in $I_{LEAKAGE}$ which otherwise would occur during the saturation condition. Saturation detection circuit 52-1 includes 4 comparators 23, 24, 25, and 26, a NOR gate 22, and a voltage reference circuit including resistors 29, 30, and 31 coupled in series between $V_{DD}$ and $V_{SS}$. Resistor 29 is connected between $V_{DD}$ and conductor 32, resistor 30 is connected between conductor 32 and conductor 33, and resistor 31 is connected between conductor 33 and $V_{SS}$. The resistances of resistors 29, 30, and 31 may, for example, be xR, R, and xR, respectively, where x is a small fraction. The (+) and (−) inputs of comparator 23 are coupled to $V_{33}$ on conductor 33 and $V_{OUT}^+$, respectively. Similarly, the (+) and (−) inputs of comparator 24 are coupled to $V_{OUT}^-$ and to $V_{32}$ on conductor 32, respectively. The (+) and (−) inputs of comparator 25 are coupled to $V_{OUT}^+$ and $V_{32}$, respectively. The (+) and (−) inputs of comparator 26 are coupled to $V_{33}$ and $V_{OUT}^-$, respectively. The outputs of comparators 23, 24, 25, and 26 are connected to the 4 inputs, respectively, of NOR gate 22. Comparators 23, 24, 25, and 26 preferably are designed to have low offset and higher bandwidth than amplifiers 3 and 11. The chopper enable signal CHOP_EN is generated by NOR gate 22 on conductor 21.

For proper operation of chopper-stabilized INA 20-1, both $V_{OUT}^+$ and $V_{OUT}^-$ must be no less than approximately 100 millivolts lower than $V_{DD}$ and no less than approximately 100 millivolts higher than $V_{SS}$, and the output of INA 20-1 is considered to be "out of range" if either $V_{OUT}^+$ or $V_{OUT}^-$ is within 100 millivolts of either $V_{DD}$ or $V_{SS}$. Therefore, the above indicated resistances xR, R, and xR of resistors 29, 30, 31, respectively, where x is selected so as to result in the voltage $V_{32}$ on conductor 32 being approximately equal to $V_{DD}$−100 millivolts, and to also result in the voltage $V_{33}$ on conductor 33 being approximately equal to $V_{SS}$+100 millivolts (or any other voltages which indicate that INA 20-1 is in or nearly in a saturated condition). If saturation detection circuit 52-1 detects a saturation condition, then it operates to disable operation of input choppers 2A and 10A whenever the outputs $V_{OUT}^+$ and/or $V_{OUT}^-$ of chopper-stabilized INA 20-1 are out of range.

During normal operation of chopper-stabilized INA 20-1, the ΔV input voltage to input chopper 2A is forced to be equal to zero by the feedback loop through feedback resistor 9 and conductor 8 as long as amplifier 3 is not in an overloaded or saturated condition. Similarly, the ΔV input voltage to input chopper 10A is forced to be equal to zero by the feedback loop through feedback resistor 16 and conductor 18 during normal operation as long as amplifier 11 is not in an overload or saturated condition. However, during a saturation/overload condition, each ΔV voltage and each corresponding input leakage current $I_{LEAKAGE}$ is determined by Equation 3 and can become very large, for example greater than the approximately 1 microampere requirement by the previously mentioned medical device standards.

Thus, the basic operation of saturation detection circuit 52-1 causes chopper enable circuit 34 of FIG. 3 to stop generating the internal chopping signal Φ and its internal logical complement signal /Φ any time either $V_{OUT}^+$ or $V_{OUT}^-$ moves to within approximately 100 millivolts of either $V_{DD}$ or $V_{SS}$, thereby disabling the input chopping operation of input choppers 2A and 10A and preventing $I_{LEAKAGE}$ from becoming excessively large (and also disabling the output chopping operation of output choppers 27A and 2A).

Figure 4:
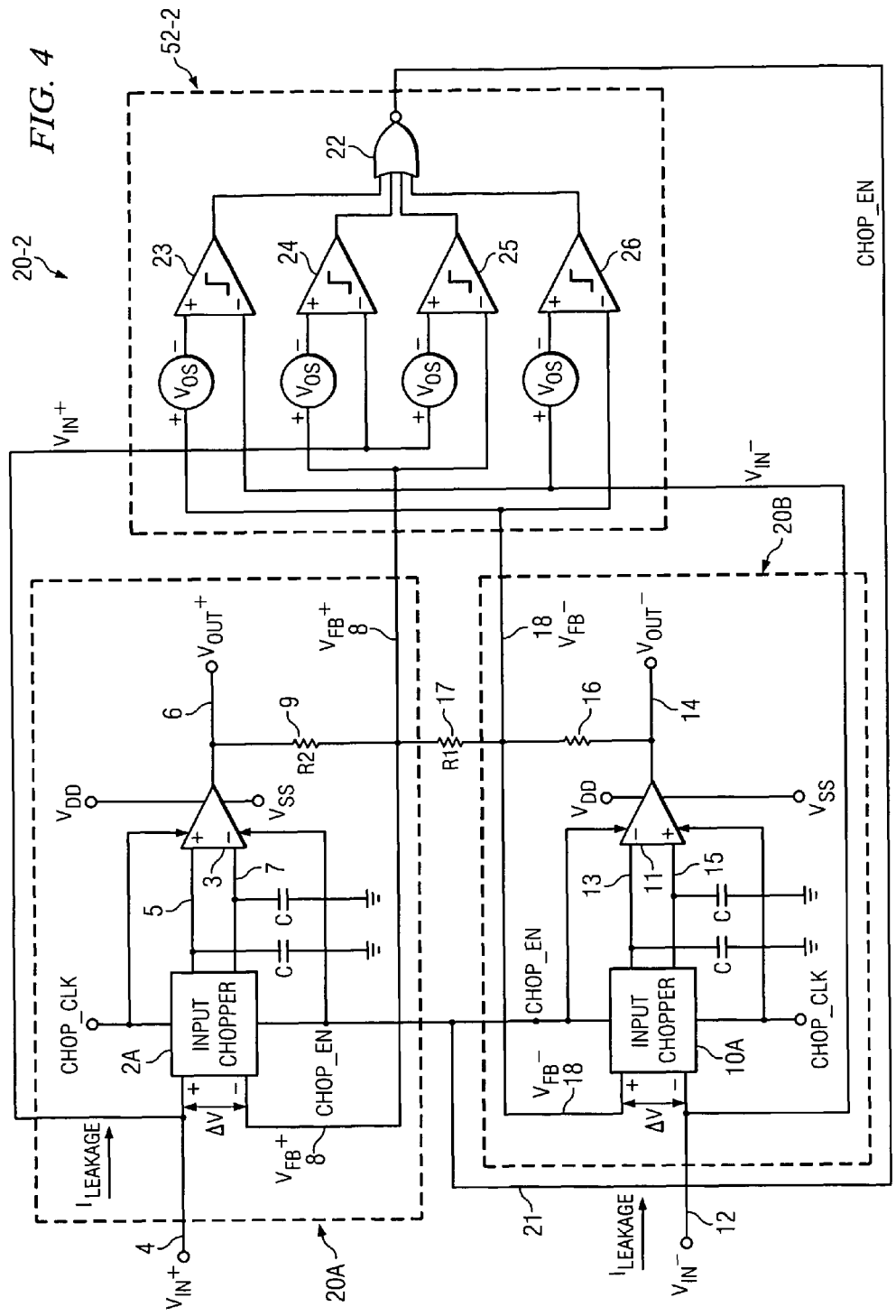
FIG. 4 is a schematic diagram of an alternative embodiment of the present invention.

FIG. 4 shows another chopper-stabilized INA 20-2 which includes a first chopper-stabilized amplifier 20A including input chopper 2A and amplifier 3, and also includes a second chopper-stabilized amplifier 20B including input chopper 10A and amplifier 11, as in FIG. 2. As in FIG. 2, both of input chopper circuits 2A and 10A and the output chopper circuit 27 included in each of amplifiers 3 and 11 are clocked in response to chopper clock signal CHOP_CLK after it has been enabled by chopper enable signal CHOP_EN, by means of enable circuit 34 in FIG. 3.

Chopper-stabilized INA 20-2 in FIG. 4 includes a saturation detection circuit 52-2 which determines from input voltages $V_{IN}^+$ and $V_{IN}^-$ when INA 20-2 is close to or in a saturation condition and accordingly disables input signal chopping by input choppers 2A and 10A and the output signal chopping by the output chopper 27 in each of amplifiers 3 and 11 in order to prevent the previously described large increases in $I_{LEAKAGE}$ which otherwise would occur during saturation.

Saturation detection circuit 52-2 includes 4 comparators 23, 24, 25, and 26 and a NOR gate 22. Each of comparators 23, 24, 25, and 26 is designed to have a built-in offset voltage Vos which is modeled in FIG. 4 as a voltage source Vos having its (−) terminal connected to the (+) input of the comparator. Note that the (+) input of each voltage source Vos is considered to be the "actual" input of the corresponding comparator. The actual (+) input and the (−) input of comparator 23 are coupled to $V_{FB}^-$ and $V_{IN}^-$, respectively. The actual (+) input and the (−) input of comparator 24 are coupled to $V_{FB}^+$ and $V_{IN}^+$, respectively. The actual (+) input and the (−) input of comparator 25 are coupled to $V_{IN}^+$ and $V_{FB}^+$, respectively. The actual (+) input and the (−) input of comparator 26 are coupled to $V_{IN}^-$ and $V_{FB}^-$, respectively.

The outputs of comparators 23, 24, 25, and 26 are connected to the 4 inputs, respectively, of NOR gate 22. The chopper enable signal CHOP_EN is generated by NOR gate 22 on conductor 21. The built-in offset voltage Vos of each of comparators 23, 24, 25, and 26 may be somewhat less than approximately 10 millivolts.

Thus, the input $\Delta V=V_{IN}^+-V_{FB}^+$ of chopper-stabilized amplifier 20A is input to a comparator having the above mentioned built-in offset Vos. If that ΔV exceeds the built-in Vos of that comparator, input chopper 2A is disabled. Also, the same input ΔV is applied between the opposite (+) and (−) inputs of another comparator, and if that ΔV exceeds the built-in Voffset of that comparator, input chopper 2A is disabled. Similarly, the input $\Delta V=V_{IN}^--V_{FB}^-$ of chopper-stabilized amplifier 20B is input to a comparator having the above mentioned built-in offset Vos. If that ΔV exceeds the built-in offset Vos of that comparator, input chopper 10A is disabled. Also, the same input ΔV is applied between the opposite (+) and (−) inputs of yet another comparator, and if that ΔV exceeds the built-in Voffset of that comparator, input chopper 10A is disabled.

However, the structure FIG. 4 does not operate to completely eliminate the leakage $I_{LEAKAGE}$ current if ΔV is less than the offset voltage Vos. The structure and technique of FIG. 4 have the shortcoming of allowing the ΔV voltages to build up to Vos. This means an amount of input leakage current $I_{LEAKAGE}$ corresponding to ΔV=Vos must be tolerated. Also, input choppers 2A and 10A may be undesirably disabled during amplifier slewing or if the amplifier feedback loop gain is insufficient. Consequently, for many applications the "output saturation detection" technique shown in FIG. 2 is preferable to "input saturation detection" technique shown in FIG. 4.

It should be understood that the invention is as applicable to a single ordinary chopper-stabilized amplifier as to an instrumentation amplifier. For example, in FIG. 2, chopper-stabilized amplifier 20A with the lower terminal 18 of gain resistor R1 connected to ground or $V_{SS}$, combined with comparators 23 and 25 and a 2-input NOR gate 22, would provide a single chopper-stabilized amplifier according to the present invention.

One advantage of the described embodiments of the invention is that excessive input leakage current $I_{LEAKAGE}$ is avoided during the substantial delay that would be required for a DSP or the like to first recognize a saturated or near-saturated condition on the basis of digitized amplifier output data and then take corrective action to reduce $I_{LEAKAGE}$. Instead, the recognition of the saturated or near-saturated condition and the generation of an input chopping disable signal occurs very rapidly in the analog domain, rather than the digital domain.

Another advantage of the described embodiments of the invention is that the local feedback provided within the chopper-stabilized amplifiers ensures that very fast corrective action is automatically performed, and that a user of the chopper-stabilized amplifier does not need to be concerned about excessive leakage current $I_{LEAKAGE}$.

Yet another advantage of the described embodiments of the invention is that they avoid the need for additional recovery time once the chopper-stabilized amplifier output signal is within its appropriate range.

Thus, the described embodiments of the invention provide local feedback within a chopper-stabilized amplifier to take fast corrective action if the output of the amplifier therein becomes saturated or nearly saturated. More specifically, the present invention provides a chopper-stabilized amplifier which prevents input leakage current from increasing beyond a predetermined limit as a result of overloading or saturation of the amplifier output, by determining if saturation is present or imminent. If that is the case, chopping of the input to the amplifier is disabled.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, although use of an AND gate and a NOR gate are disclosed, it is to be understood that by way of definition, the term "ORing gate" used herein is intended to encompass either an OR gate or a NOR gate, and the term "ANDing gate" used herein is intended to encompass either an AND gate or a NAND gate. And of course, an "ANDing" gate may perform an "ORing" function on "negative logic" inputs and an "ORing" gate may perform an "ANDing" function for negative logic inputs.

What is claimed is:

1. A chopper-stabilized amplifier comprising:
   a first amplifier;
   a first input chopper circuit having a first input coupled to receive a first input signal, a first output coupled to a first input of the first amplifier, a second output coupled to a second input of the first amplifier, the second input of the first amplifier being coupled to receive a first feedback signal, wherein the first chopper input circuit operates in response to a chopping clock and in response to a chop enable signal;
   a first feedback resistor coupled between an output of the first amplifier and the second input of the first amplifier for producing the first feedback signal;
   a gain resistor having a first terminal coupled to the second input of the first amplifier and a second terminal coupled to receive a predetermined voltage; and
   saturation detection circuitry coupled to a signal path in the chopper-stabilized amplifier for comparing a signal level in the signal path to a reference to generate the chop enable signal if the amplifier is in a normal operating mode and disabling the chop enable signal if the first amplifier is unacceptably close to a saturation condition.

2. The chopper-stabilized amplifier of claim 1 wherein the first input chopper circuit couples a chopped representation of the first feedback signal from a second input of the first chopper circuit to the second input of the first amplifier.

3. The chopper-stabilized amplifier of claim 1 including a chopping enable circuit including an ANDing circuit having a first input for receiving the chopping clock and an enable input for receiving the chop enable signal, and an output for producing an enabled chopping clock signal for controlling chopping switches in the first input chopper circuit.

4. The chopper-stabilized amplifier of claim 1 wherein the first amplifier includes output chopper circuitry coupled to the output of the first amplifier, a first output signal of the chopper-stabilized amplifier being generated by the output chopper circuitry on the output of the first amplifier.

5. The chopper-stabilized amplifier of claim 3 wherein the chopping enable circuit includes circuitry for generating an enabled chopping clock complement signal which is the logical complement of the enabled chopping clock.

6. The chopper-stabilized amplifier of claim 4 wherein the saturation detection circuitry includes a first comparator having a first input coupled to a first reference voltage, a second input coupled to receive the first output signal, and an output coupled to a first input of an ORing circuit having an output on which the chopper enable signal is produced, and a second comparator having a first input coupled to receive the first output signal and a second input coupled to a second reference voltage, and an output coupled to a second input of the ORing circuit.

7. The chopper-stabilized amplifier of claim 4 wherein the saturation detection circuitry includes a first comparator having a built-an offset and having a first input coupled to the first input signal, a second input coupled to receive the first feedback signal, and an output coupled to a first input of an ORing circuit having an output on which the chopper enable signal is produced, and a second comparator having a first input coupled to receive the first feedback signal and a second input coupled to receive the first input signal, and an output coupled to a second input of the ORing circuit.

8. The chopper-stabilized amplifier of claim 6 wherein the first amplifier is powered by a first supply voltage and a second supply voltage, the chopper-stabilized amplifier including a reference circuit including first, second, and third resistors coupled in series between the first supply voltage and the second supply voltage, the first resistor being coupled between the first supply voltage and the second reference voltage, the second resistor being coupled between the second reference voltage and the first reference voltage, and the third resistor being coupled between the first reference voltage and the second supply voltage.

9. The chopper-stabilized amplifier of claim 6 wherein the chopper-stabilized amplifier is a chopper-stabilized instrumentation amplifier including the first amplifier, the first input chopper circuit, the first feedback resistor, the gain resistor, and the saturation detection circuitry, the instrumentation amplifier also including
   a second amplifier having an output on which a second output signal is produced;

a second input chopper circuit having a first input coupled to receive a second input signal, a second input coupled to receive a second feedback signal, a first output coupled to a first input of the second amplifier, a second output coupled to a second input of the second amplifier, wherein the second input chopper circuit operates in response to the chopping clock and in response to the chop enable signal;

a second feedback resistor coupled between an output of the second amplifier and the second input of the second input chopper circuit for producing the second feedback signal;

the second terminal of the gain resistor being coupled to the second input of the second input chopper circuit; and the saturation detection circuitry including a third comparator having a first input coupled to receive the second output signal, a second input coupled to the second reference voltage, and an output coupled to a third input of the ORing circuit, the saturation detection circuitry also including a fourth comparator having a first input coupled to receive the first reference voltage, a second input coupled to receive the second output signal, and an output coupled to a fourth input of the ORing circuit.

10. The chopper-stabilized amplifier of claim 8 wherein the first reference voltage is approximately a millivolt greater than the second supply voltage and the second reference voltage is approximately a millivolt less than the first supply voltage.

11. The chopper-stabilized amplifier of claim 5 wherein the input chopper circuit includes first, second, third, and fourth switches, the first switch being controlled by the enabled chopping clock signal and having a first terminal, and also having a second terminal coupled to the second input of the first amplifier, the second switch being controlled by the enabled chopping clock signal and having a first terminal, and also having a second terminal coupled to the first input of the first amplifier, an input difference signal being applied between the first terminals of the first and second switches, the third switch being controlled in accordance with the enabled chopping clock complement signal and having a first terminal coupled to the first terminal of the first switch and a second terminal coupled to the first input of the first amplifier, the fourth switch being controlled in accordance with the enabled chopping clock complement signal and having a first terminal coupled to the first terminal of the third switch and a second terminal coupled to the second input of the first amplifier.

12. The chopper-stabilized amplifier of claim 9 wherein the first and second amplifiers are transconductance amplifiers.

13. The chopper-stabilized amplifier of claim 9 wherein the first, second, third, and fourth comparators have lower offset and higher bandwidth than the first and second amplifiers.

14. The chopper-stabilized amplifier of claim 9 wherein the predetermined voltage is a fixed reference voltage.

15. A method for reducing input leakage current in a chopper-stabilized amplifier including an amplifier, an input chopper circuit having a first input coupled to receive an input signal, and an output coupled to a first input of the amplifier, a feedback resistor being coupled to an output of the amplifier to couple a feedback signal to a second input of the amplifier, the chopper-stabilized amplifier producing an output signal, wherein the input chopper circuit operates in response to a chopping clock, the method comprising:

operating the chopper-stabilized amplifier in a normal mode;

determining if the amplifier is unacceptably close to a saturation condition by comparing a signal level in a signal path of the chopper-stabilized amplifier to a reference value; and disabling the chopping clock if the amplifier is determined to be unacceptably close to the saturation condition.

16. The method of claim 15 including logically ANDing the chopping clock and a chop enable signal to produce an enabled chopping clock signal for controlling chopping switches in the input chopper circuit during the operation in the normal mode.

17. The method of claim 16 wherein step (c) includes comparing a difference between a first reference voltage and the first output signal and disabling the enabled chopping clock signal if that difference is positive, and comparing a difference between the first output signal and a second reference voltage and disabling the enabled chopping clock signal if that difference is positive.

18. The method of claim 17 wherein the first reference voltage is approximately a millivolt greater than a low side supply voltage of the amplifier and the second reference voltage is approximately a millivolt less than a high side supply voltage of the amplifier.

19. The method of claim 16 including generating an enabled chopping clock complement signal in response to the enabled chopping clock and controlling some of the chopping switches directly in response to the enabled chopping clock complement signal.

* * * * *